United States Patent
Gupta et al.

(10) Patent No.: US 11,075,141 B2
(45) Date of Patent: Jul. 27, 2021

(54) MODULE BASE WITH INTEGRATED THERMAL SPREADER AND HEAT SINK FOR THERMAL AND STRUCTURAL MANAGEMENT OF HIGH-PERFORMANCE INTEGRATED CIRCUITS OR OTHER DEVICES

(71) Applicant: Raytheon Company, Waltham, MA (US)

(72) Inventors: Anurag Gupta, Canton, MA (US); David A. Brooks, Holden, MA (US); Mary K. Herndon, Littleton, MA (US)

(73) Assignee: Raytheon Company, Waltham, MA (US)

( * ) Notice: Subject to any disclaimer, the term of this patent is extended or adjusted under 35 U.S.C. 154(b) by 90 days.

(21) Appl. No.: 16/569,330

(22) Filed: Sep. 12, 2019

(65) Prior Publication Data
US 2020/0091035 A1    Mar. 19, 2020

Related U.S. Application Data

(60) Provisional application No. 62/731,676, filed on Sep. 14, 2018.

(51) Int. Cl.
*H01L 23/42* (2006.01)
*H01L 21/48* (2006.01)
(Continued)

(52) U.S. Cl.
CPC .......... *H01L 23/42* (2013.01); *H01L 21/4882* (2013.01); *H01L 23/367* (2013.01); *H01L 23/46* (2013.01)

(58) Field of Classification Search
CPC .... H01L 23/42; H01L 21/4882; H01L 23/367
(Continued)

(56) References Cited

U.S. PATENT DOCUMENTS 3,156,091 A    11/1964    Kraus
3,980,105 A     9/1976    Myskowski
(Continued)

FOREIGN PATENT DOCUMENTS

EP    1783833 A2    5/2007
JP    2000150743 A    5/2000
(Continued)

OTHER PUBLICATIONS

Darwish et al., "Three Dimensional Transmission Lines and Power Divider Circuits", 2009 4th International Conference on Design & Technology of Integrated Systems in Nanoscale Era, Apr. 2009, 7 pages.

(Continued)

*Primary Examiner* — Didarul A Mazumder (57) ABSTRACT

An apparatus includes a module base configured to carry one or more devices to be cooled. The module base includes a cover and a heat sink connected to the cover. The cover includes first and second encapsulation layers and a thermal spreader between the encapsulation layers. The first encapsulation layer is configured to receive thermal energy from the device(s). The thermal spreader is configured to spread out at least some of the thermal energy and to provide the spread-out thermal energy to the second encapsulation layer. The heat sink is configured to receive the thermal energy through the second encapsulation layer and to transfer the thermal energy out of the module base. The first encapsulation layer includes multiple openings. The module base includes multiple tabs inserted through the openings. Each tab is configured to provide a thermal interface between at least one of the device(s) and the thermal spreader through the first encapsulation layer.

30 Claims, 6 Drawing Sheets

(51) Int. Cl.
*H01L 23/46* (2006.01)
*H01L 23/367* (2006.01)

(58) Field of Classification Search
USPC .......................................................... 257/713
See application file for complete search history.

(56) References Cited

U.S. PATENT DOCUMENTS

| | | |
|---|---|---|
| 4,057,610 A | 11/1977 | Goettler et al. |
| 4,627,472 A | 12/1986 | Goettler et al. |
| 4,672,472 A | 6/1987 | Sugiyama |
| 5,241,450 A | 8/1993 | Bernhardt et al. |
| 5,434,362 A | 7/1995 | Klosowiak et al. |
| 5,545,924 A | 8/1996 | Contolatis et al. |
| 6,075,701 A | 6/2000 | Ali et al. |
| 6,387,462 B1 | 5/2002 | Blain et al. |
| 6,674,347 B1 | 1/2004 | Maruhashi et al. |
| 6,717,813 B1 | 4/2004 | Garner |
| 7,005,584 B2 | 2/2006 | Levi et al. |
| 7,303,005 B2 | 12/2007 | Reis et al. |
| 7,391,382 B1 | 6/2008 | Mason et al. |
| 8,780,561 B2 | 7/2014 | Danello et al. |
| 9,093,442 B1 | 7/2015 | Huynh et al. |
| 9,318,450 B1 | 4/2016 | Reza et al. |
| 9,889,624 B2 | 2/2018 | Trulli |
| 9,942,975 B2 | 4/2018 | Elliott et al. |
| 9,978,698 B1 | 5/2018 | Trulli et al. |
| 10,232,582 B2 | 3/2019 | Trulli |
| 2002/0006523 A1 | 1/2002 | Obeshaw |
| 2002/0043402 A1* | 4/2002 | Juskey ................ H01L 23/3128 174/260 |
| 2002/0167800 A1 | 11/2002 | Smalc |
| 2003/0042153 A1 | 3/2003 | Farrar et al. |
| 2003/0116312 A1 | 6/2003 | Krassowski et al. |
| 2006/0096740 A1* | 5/2006 | Zheng ................ F28D 15/0233 165/104.26 |
| 2007/0053168 A1 | 3/2007 | Sayir et al. |
| 2007/0115076 A1 | 5/2007 | Khazanov |
| 2007/0210082 A1* | 9/2007 | English ................ H05K 9/0032 220/4.21 |
| 2007/0262836 A1 | 11/2007 | Voss |
| 2009/0066420 A1 | 3/2009 | Lopez |
| 2009/0091892 A1 | 4/2009 | Otsuka et al. |
| 2009/0129011 A1* | 5/2009 | Balzano ................ H01L 23/473 361/689 |
| 2010/0177796 A1 | 7/2010 | Miller |
| 2010/0297857 A1* | 11/2010 | Ito ........................ H01R 12/523 439/65 |
| 2011/0030924 A1 | 2/2011 | Kawabata et al. |
| 2011/0141690 A1* | 6/2011 | Le ........................ H01L 23/4735 361/689 |
| 2012/0061127 A1* | 3/2012 | Fields .................... H01L 23/373 174/252 |
| 2012/0063097 A1 | 3/2012 | Reza et al. |
| 2013/0092354 A1 | 4/2013 | Semenov et al. |
| 2013/0208434 A1 | 8/2013 | Alm |
| 2013/0271905 A1 | 10/2013 | Sullivan |
| 2013/0308274 A1 | 11/2013 | Murdock et al. |
| 2014/0213094 A1* | 7/2014 | Rowlette ............. F21V 19/0035 439/366 |
| 2015/0015453 A1* | 1/2015 | Puzella ................ H05K 1/0206 343/853 |
| 2015/0062802 A1 | 3/2015 | Grunow et al. |
| 2015/0253089 A1* | 9/2015 | Fan ...................... H01L 23/3736 165/185 |
| 2015/0382509 A1 | 12/2015 | Nagata et al. |
| 2016/0049351 A1 | 2/2016 | McCann |
| 2016/0174356 A1* | 6/2016 | Singh ..................... H01G 2/065 174/252 |
| 2016/0276242 A1 | 9/2016 | Trulli |
| 2016/0316570 A1 | 10/2016 | De Vaan et al. |
| 2017/0042058 A1 | 2/2017 | Pope et al. |
| 2017/0100907 A1 | 4/2017 | Trulli |
| 2017/0284647 A1 | 10/2017 | Morin et al. |
| 2017/0325332 A1 | 11/2017 | Long et al. |
| 2018/0228065 A1* | 8/2018 | Wrona ................ H05K 7/20918 |
| 2018/0366597 A1* | 12/2018 | Carlson ................ H01L 31/0747 |
| 2019/0295918 A1 | 9/2019 | Trulli et al. |
| 2019/0313522 A1 | 10/2019 | Trulli et al. |

FOREIGN PATENT DOCUMENTS

| | | |
|---|---|---|
| JP | 2001267441 A | 9/2001 |
| WO | 2011/008467 A1 | 1/2011 |

OTHER PUBLICATIONS

Tehrani et al., "Inkjet-Printed 3D Interconnects for Millimeter-Wave System-on-Package Solutions", 2016 IEEE/MTT-S International Microwave Symposium—MTT 2016, May 2016, 4 pages.

Whelan et al., "GaN Technology for Radars", CS MANTECH Conference, Apr. 2012, 4 pages.

Gries, "Photonics Applied: Microelectronics Processing: Laser direct structuring creates low-cost 3D integrated circuits", Oct. 2010, 8 pages.

International Search Report and Written Opinion of the International Searching Authority in connection with counterpart International Patent Application No. PCT/US2019/050854 dated Nov. 22, 2019, 9 pages.

* cited by examiner

MODULE BASE WITH INTEGRATED THERMAL SPREADER AND HEAT SINK FOR THERMAL AND STRUCTURAL MANAGEMENT OF HIGH-PERFORMANCE INTEGRATED CIRCUITS OR OTHER DEVICES

CROSS-REFERENCE TO RELATED APPLICATION AND PRIORITY CLAIM

This application claims priority under 35 U.S.C. § 119(e) to U.S. Provisional Patent Application No. 62/731,676 filed on Sep. 14, 2018. This provisional application is hereby incorporated by reference in its entirety.

TECHNICAL FIELD

This disclosure is generally directed to cooling systems. More specifically, this disclosure is directed to a module base with an integrated thermal spreader and heat sink for thermal and structural management of high-performance integrated circuits or other devices.

BACKGROUND

High-performance integrated circuits are used in a number of applications. For example, monolithic microwave integrated circuits (MMICs) are integrated circuits that operate within the microwave band of the radio frequency (RF) spectrum. As integrated circuits continue to become smaller and more powerful, the cooling of the integrated circuits becomes more and more difficult.

SUMMARY

This disclosure provides a module base with an integrated thermal spreader and heat sink for thermal and structural management of high-performance integrated circuits or other devices.

In a first embodiment, an apparatus includes a module base configured to carry one or more devices to be cooled. The module base includes a cover and a heat sink connected to the cover. The cover includes first and second encapsulation layers and a thermal spreader between the first and second encapsulation layers. The first encapsulation layer is configured to receive thermal energy from the one or more devices to be cooled. The thermal spreader is configured to spread out at least some of the thermal energy received through the first encapsulation layer and to provide the spread-out thermal energy to the second encapsulation layer. The heat sink is configured to receive the thermal energy through the second encapsulation layer and to transfer the thermal energy out of the module base. The first encapsulation layer includes multiple openings. The module base further includes multiple tabs inserted through the openings. Each tab is configured to provide a thermal interface between at least one of the one or more devices to be cooled and the thermal spreader through the first encapsulation layer.

In a second embodiment, a system includes one or more devices to be cooled and a module base carrying the one or more devices. The module base includes a cover and a heat sink connected to the cover. The cover includes first and second encapsulation layers and a thermal spreader between the first and second encapsulation layers. The first encapsulation layer is configured to receive thermal energy from the one or more devices. The thermal spreader is configured to spread out at least some of the thermal energy received through the first encapsulation layer and to provide the spread-out thermal energy to the second encapsulation layer. The heat sink is configured to receive the thermal energy through the second encapsulation layer and to transfer the thermal energy out of the module base. The first encapsulation layer includes multiple openings. The module base further includes multiple tabs inserted through the openings. Each tab is configured to provide a thermal interface between at least one of the one or more devices to be cooled and the thermal spreader through the first encapsulation layer.

In a third embodiment, a method includes placing a thermal spreader between first and second encapsulation layers. The first encapsulation layer is configured to receive thermal energy from one or more devices to be cooled. The thermal spreader is configured to spread out at least some of the thermal energy received through the first encapsulation layer and to provide the spread-out thermal energy to the second encapsulation layer. The method also includes connecting the first and second encapsulation layers together to secure the thermal spreader between the first and second encapsulation layers. The method further includes inserting multiple tabs through openings in the first encapsulation layer. Each tab is configured to provide a thermal interface between at least one of the one or more devices to be cooled and the thermal spreader through the first encapsulation layer. In addition, the method includes connecting a heat sink to the second encapsulation layer. The heat sink is configured to receive the thermal energy through the second encapsulation layer and to transfer the thermal energy.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 6, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, cooling of integrated circuits like monolithic microwave integrated circuits (MMICs) is becoming more and more difficult as the integrated circuits become smaller and more powerful. One approach for cooling MMICs involves bonding a surface of the MMIC's substrate to a cooling structure, such as with a layer of thermal interface material (TIM) added between the MMIC's substrate and the cooling structure. The cooling structure may be made of a high thermal conductivity material (such as aluminum) and can function as a thermal spreader or cold plate. Heat may be ultimately removed from the cooling structure using a remotely-place heat sink, such as a liquid-cooled metallic heat sink. Unfortunately, this approach may not be thermally efficient due to high heat fluxes generated within the MIMIC and due to high thermal resistances created between the MIMIC and the ultimate heat sink via the cooling structure.

Another approach for cooling MMICs involves bonding an MMIC to a heat spreader using a first layer of thermal interface material, where the heat spreader is bonded to a cooling structure using another layer of thermal interface material. While this approach alleviates heat fluxes at the cooling structure with heat-spreading in the heat spreader, the use of multiple layers of thermal interface materials adds undesirable thermal resistances in the architecture. Yet another approach for cooling MMICs involves bonding the MMIC-heat spreader-cooling structure architecture to an ultimate heat sink, such as a liquid-cooled heat sink, with a third layer of thermal interface material. While this approach brings the ultimate heat sink in close proximity to the cooling structure (thereby limiting the thermal resistances caused by a remotely-placed heat sink), the use of three layers of thermal interface materials creates additional thermal resistances, thereby limiting thermal cooling performance of the architecture.

Beyond the issues noted above, in these types of cooling approaches, multiple materials are being used in a stacked architecture, such as a silicon or silicon carbide MIMIC substrate, a polymeric thermal interface material, a molybdenum heat spreader, an aluminum cooling structure, and an aluminum heat sink. The presence of multiple materials in the architecture creates mismatches in the coefficients of thermal expansion (CTEs) between the various components. This means that the components can expand and contract at different rates when the temperatures of the components vary, which is common when the integrated circuits generate large amounts of heat during operation. This can result in significant structural stresses, caused by thermal strains, on the components themselves, on various layers of packaging, and on an overall package containing the components. These stresses can result in undesirable deformations of various components or even local structural failures within the packaging. While thermal interface materials, being compliant in nature, can sometimes be used to help compensate for differences in coefficients of thermal expansion, the thermal interface materials are themselves prone to developing undesirable structural stresses. Moreover, the thermal performance of thermal interface materials is inherently a significant bottleneck to heat transfer, thereby increasing thermal resistance. Further, material and processing costs associated with the use of thermal interface materials increase the costs of the overall packages. In addition, packaging architectures may be limited in their geometries and device configurations due to constraints introduced by the use of the thermal interface materials.

This disclosure describes techniques that provide for an integrated approach to achieve improved thermal and structural performance of one or more high-performance integrated circuits or other devices and their thermal management mechanisms. As described in more detail below, an integrated approach to packaging is provided that combines a thermal spreader and a heat sink into a module base, which can be packaged with one or more integrated circuit devices or other devices to be cooled. In some embodiments, the thermal spreader is implemented in the module base using one or more sheets of thermal pyrolytic graphite (TPG) or other form of graphite. Due to the directional variation in the thermal conductivity of TPG or other graphite materials, the graphite can be preferentially oriented to utilize its high thermal conductivity in certain directions. Also embedded within the module base are small pieces of graphite or other high thermal conductivity and low-CTE tabs, which can be positioned preferentially to interface with the one or more integrated circuit devices or other devices to be cooled and the module base. This type of an arrangement helps to provide improved in-plane and through-plane (orthotropic) heat conduction away from the one or more devices to be cooled. The thermal spreader can be easily tailored to various geometries, and the thermal spreader can be clad with a variety of metals or other highly thermally conductive material(s) to tailor the thermal and structural performance of the module base for a specific application through control of the thermal conductivity and/or CTE of the embedded materials.

The heat sink is also incorporated into the overall module base structure, such as at the bottom of the module base or otherwise on a side opposite the heat spreader. The heat sink can be used for routing at least one coolant liquid flow or for otherwise removing heat from the module base. In some embodiments, the heat sink can be machined into the bottom surface or other surface of the module base. In other embodiments, the heat sink could be fabricated separately and then fused or otherwise connected to the module base, such as via brazing or thermo-compression bonding.

These techniques allow for the integration of a module base, a thermal spreader, and a heat sink into a single fully-integrated thermal management structure, which can reduce the size and cost of the structure itself and of an overall package that includes the structure. Also, these techniques can reduce the number of thermal interface materials and the number of components used in the overall package. This can help to provide significantly-improved thermal and structural performance of the overall package and can further reduce the size and cost of the overall package. Further, these techniques allow for the introduction of high-performance and closely-matched material sets within the integrated structure and within the overall package. This can help to reduce CTE mismatches and improve the removal of heat from one or more devices to be cooled, and this can help to reduce the stresses placed on the package over the expected temperature range of the package. Greater flexibility in material choices also helps mitigate corrosion risks, which can potentially be caused by material galvanic mismatches. In addition, integrating a module base, a thermal spreader, and a heat sink in a single structure supports a paradigm shift from remote cooling to near-junction thermal transport, thereby offering significantly-enhanced thermal management effectiveness for high heat-flux devices. Overall, this allows an integrated thermal management architecture to simultaneously address thermal, structural, and corrosion performance.

Figure 1:
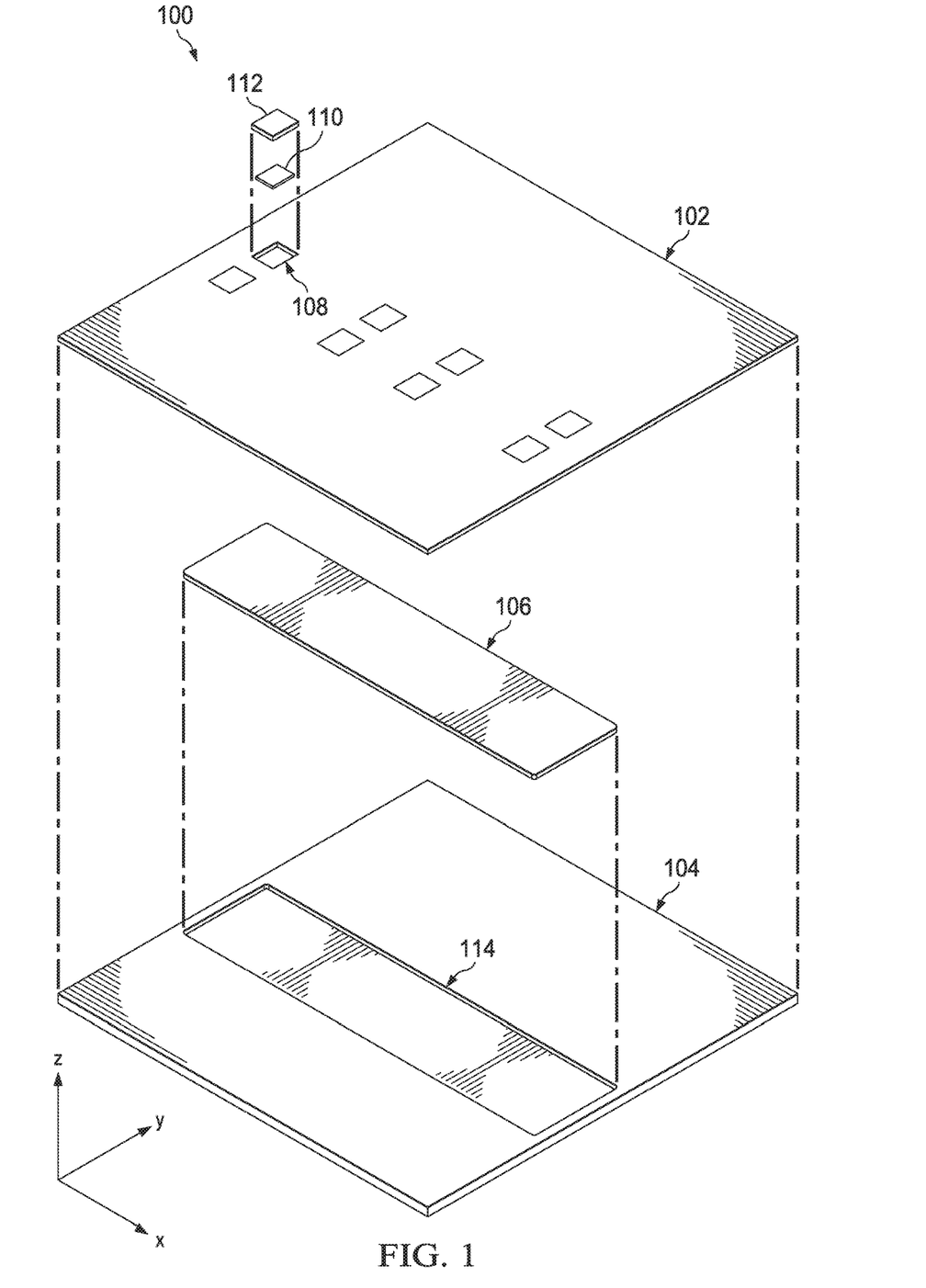
FIG. 1 illustrates a first example cover with an integrated thermal spreader for a module base according to this disclosure.

FIG. 1 illustrates a first example cover 100 with an integrated thermal spreader for a module base according to this disclosure. As shown in FIG. 1, the cover 100 includes a top encapsulation layer 102 and a bottom encapsulation layer 104. The top encapsulation layer 102 generally operates to receive thermal energy from one or more integrated circuit devices or other devices to be cooled. The bottom encapsulation layer 104 generally operates to provide the thermal energy to an underlying structure, such as a cold plate or other heat sink, for removal. The top and bottom encapsulation layers 102 and 104 also encase or otherwise substantially or completely surround an integrated thermal spreader 106.

Each of the encapsulation layers 102 and 104 includes any suitable structure for transporting thermal energy and encapsulating or otherwise receiving a thermal spreader. Each of the encapsulation layers 102 and 104 can be formed from any suitable material(s). For example, each of the encapsulation layers 102 and 104 can be formed from copper, aluminum, or other material(s) having a high thermal conductivity. Each of the encapsulation layers 102 and 104 can also be formed in any suitable manner. In addition, each of the encapsulation layers 102 and 104 can have any suitable size, shape, and dimensions. As particular examples, each of the encapsulation layers 102 and 104 can have a square shape with sides that are about 3.4 inches (about 8.636 cm) in length. Of course, any other suitable size and shape can be used with the encapsulation layers 102 and 104. Also, there is no requirement that the encapsulation layers 102 and 104 have identical sizes and shapes.

The thermal spreader 106 generally operates to spread out at least some of the thermal energy received by the top encapsulation layer 102. The thermal spreader 106 also operates to provide this spread-out thermal energy to the bottom encapsulation layer 104 for removal. In this way, the thermal spreader 106 helps to distribute the thermal energy received from one or more integrated circuit devices or other devices to be cooled over a larger area of the top and bottom encapsulation layers 102 and 104. This helps to facilitate removal of the thermal energy from the bottom encapsulation layer 104 and reduces the temperature of the one or more integrated circuit devices or other devices to be cooled.

The thermal spreader 106 includes any suitable structure for spreading out thermal energy. The thermal spreader 106 can be formed from any suitable material(s). For example, the thermal spreader 106 can be formed from thermal pyrolytic graphite (TPG), extruded graphite, or diamond. The thermal spreader 106 may also be clad or plated with one or more materials before being encapsulated in the layers 102 and 104. The thermal spreader 106 can also be formed in any suitable manner, such as by cutting a graphite or other sheet or extruding the graphite or other material(s). In some embodiments, the thermal spreader 106 can also be placed in a suitable preferential orientation, such as to make effective use of the orthotropic (different in different axes) thermal conductivity property of TPG or other graphite. In addition, the thermal spreader 106 can have any suitable size, shape, and dimensions. As particular examples, the thermal spreader 106 can have a rectangular shape with a smaller dimension of about 0.78 inches (about 1.9812 cm) and a longer dimension slightly less than the length or width of the encapsulation layer(s) 102 or 104. The thermal spreader 106 can also have straight or rounded corners. Of course, any other size and shape can be used with the thermal spreader 106.

The top encapsulation layer 102 includes various openings 108, and each opening 108 provides access to a portion of the underlying thermal spreader 106. Each opening 108 can have any suitable size, shape, and dimensions. As particular examples, each opening 108 can have a rectangular shape with a smaller dimension of about 0.189 inches (about 0.48006 cm) and a longer dimension of about 0.233 inches (about 0.59182 cm). Each opening 108 can also have straight or rounded corners. Of course, any other size and shape can be used with the openings 108.

A tab 110 and a cladding 112 are inserted into each of the openings 108. Each tab 110 generally operates to provide thermal energy received through the associated cladding 112 down to the thermal spreader 106. Each cladding 112 generally operates to provide thermal energy received from one or more devices to be cooled to the associated tab 110 and to protect the associated tab 110. The claddings 112 can be attached to the top encapsulation layer 102 in any suitable manner, such as via thermo-compression bonding, brazing, soldering, or welding.

Each tab 110 can be formed from any suitable material(s), such as graphite (like thermal pyrolytic graphite or extruded graphite), diamond, or metal (such as copper, copper tungsten, molybdenum, or copper molybdenum). In some embodiments, the tabs 110 are formed from the same material(s) as the thermal spreader 106, although this is not required. Also, the tabs 110 can be oriented preferentially to utilize the orthotropic thermal conductivity of the material, such when formed from TPG or other graphite. Further, each tab 110 can be formed in any suitable manner, such as by cutting a graphite or other sheet, extruding the graphite or other material(s), or forming the material(s) in the desired shape. In addition, each tab 110 can have any suitable size, shape, and dimensions. As particular examples, each tab 110 can have a rectangular shape with a smaller dimension of about 0.149 inches (about 0.37846 cm) and a longer dimension of about 0.193 inches (about 0.49022 cm) and a thickness of about 0.01 inches (about 0.0254 cm). Each tab 110 can also have straight or rounded corners. Of course, any other size and shape can be used with the tabs 110.

Each cladding 112 can be formed from any suitable material(s), such as copper, copper tungsten, molybdenum, copper molybdenum, aluminum, or other material(s) having a high thermal conductivity. In some embodiments, the claddings 112 are formed from the same material(s) as the top encapsulation layer 102, although this is not required. In some embodiments, the claddings 112 are formed using one or more materials that have a CTE substantially matching the CTE of at least one substrate of the one or more integrated circuit devices or other devices to be cooled, such as when the claddings 112 are formed using tungsten and are used with one or more MMIC substrates formed using silicon carbide. Also, in some embodiments, the claddings 112 are plated with a thin layer of metal to protect against galvanic corrosion that might be caused by the different metal of the encapsulation layer 102. In particular embodiments, the plating may also provide protection against galvanic corrosion from the cladding 112 or any plating on the thermal spreader 106. Each cladding 112 can also be formed in any suitable manner, such as by cutting a copper or other sheet or forming the material(s) in the desired shape. In addition, each cladding 112 can have any suitable size, shape, and dimensions. As particular examples, each cladding 112 can have a rectangular shape with a smaller dimension of about 0.189 inches (about 0.48006 cm) and a longer dimension of about 0.233 inches (about 0.59182 cm) and a thickness of about 0.02 inches (about 0.0508 cm).

Each cladding 112 can also have straight or rounded corners. Of course, any other size and shape can be used with the claddings 112.

The openings 108, tabs 110, and claddings 112 are used here to interface the thermal spreader 106 with one or more devices to be cooled through the top encapsulation layer 102. This helps to provide improved heat conduction away from the one or more devices to be cooled to the thermal spreader 106. Note that while eight openings 108, eight tabs 110, and eight claddings 112 are shown here in a four-by-two arrangement, any suitable numbers and arrangements of openings 108, tabs 110, and claddings 112 can be used. For example, the structure shown in FIG. 1 can be used to cool eight MMIC devices or other devices that are placed in a four-by-two arrangement. Thus, other numbers and arrangements of devices to be cooled can result in other numbers and arrangements of openings 108, tabs 110, and claddings 112. In general, one or more openings 108, one or more tabs 110, and one or more claddings 112 can be used with each device to be cooled, and each opening 108, tab 110, and cladding 112 may be used with one device or multiple devices to be cooled.

The thermal spreader 106 in this example fits at least partially within a recess 114 formed in the bottom encapsulation layer 104. The recess 114 can be sized and shaped so that it closely matches the size and shape of the thermal spreader 106 and makes good thermal contact with the sides of the thermal spreader 106. In some embodiments, the thermal spreader 106 fits entirely within the recess 114. In other embodiments, the thermal spreader 106 fits partially within the recess 114 and partially within another recess in the bottom of the top encapsulation layer 102 (not shown). Once the thermal spreader 106 is positioned within the recess(es) 114, the encapsulation layers 102 and 104 can be attached to each other, such as via thermo-compression bonding, brazing, soldering, or welding, to encapsulate the thermal spreader 106. Each recess 114 can be formed in an encapsulation layer 102 or 104 in any suitable manner, such as by etching the encapsulation layer to form the recess or by fabricating the encapsulation layer to include the recess.

As described in more detail below, the cover 100 shown in FIG. 1 can be secured to a heat sink. This integrates the thermal spreader 106 and the heat sink to form at least part of a module base. One or more integrated circuit devices or other devices to be cooled can be mounted on or to the cover 100. The module base supports improved thermal and structural management of the devices to be cooled. For example, there may be no need to use any thermal interface materials between the thermal spreader 106 and the encapsulation layers 102 and 104 or between the bottom encapsulation layer 104 and the heat sink. This can eliminate one or multiple layers of thermal interface materials, which lowers the cost and complexity of the overall package. Moreover, the coefficients of thermal expansion of the various components can be closely matched in the module base, which helps to reduce stresses on the module base, its components, and the one or more devices to be cooled.

In some embodiments, the tabs 110 and the thermal spreader 106 are formed from thermal pyrolytic graphite. Thermal pyrolytic graphite typically has higher thermal conductivities in two dimensions and a lower thermal conductivity in a third dimension. In particular embodiments, the tabs 110 and the thermal spreader 106 can be configured so that they have higher thermal conductivities in the x and z dimensions identified in FIG. 1 and a lower thermal conductivity in they dimension identified in FIG. 1. As a particular example, the tabs 110 may be preferentially oriented in this manner to take advantage of a certain transistor layout of an MMIC, which might span almost the entire dimension of the MIMIC in the y direction, thereby reducing or eliminating the need to spread heat in they direction. This arrangement allows the tabs 110 and the thermal spreader 106 to efficiently spread out the thermal energy received from the one or more devices to be cooled along preferential directions. This arrangement also allows the tabs 110 and the thermal spreader 106 to efficiently transport the thermal energy received from the one or more devices to be cooled to the bottom encapsulation layer 104 for removal from the cover 100.

Figure 2:
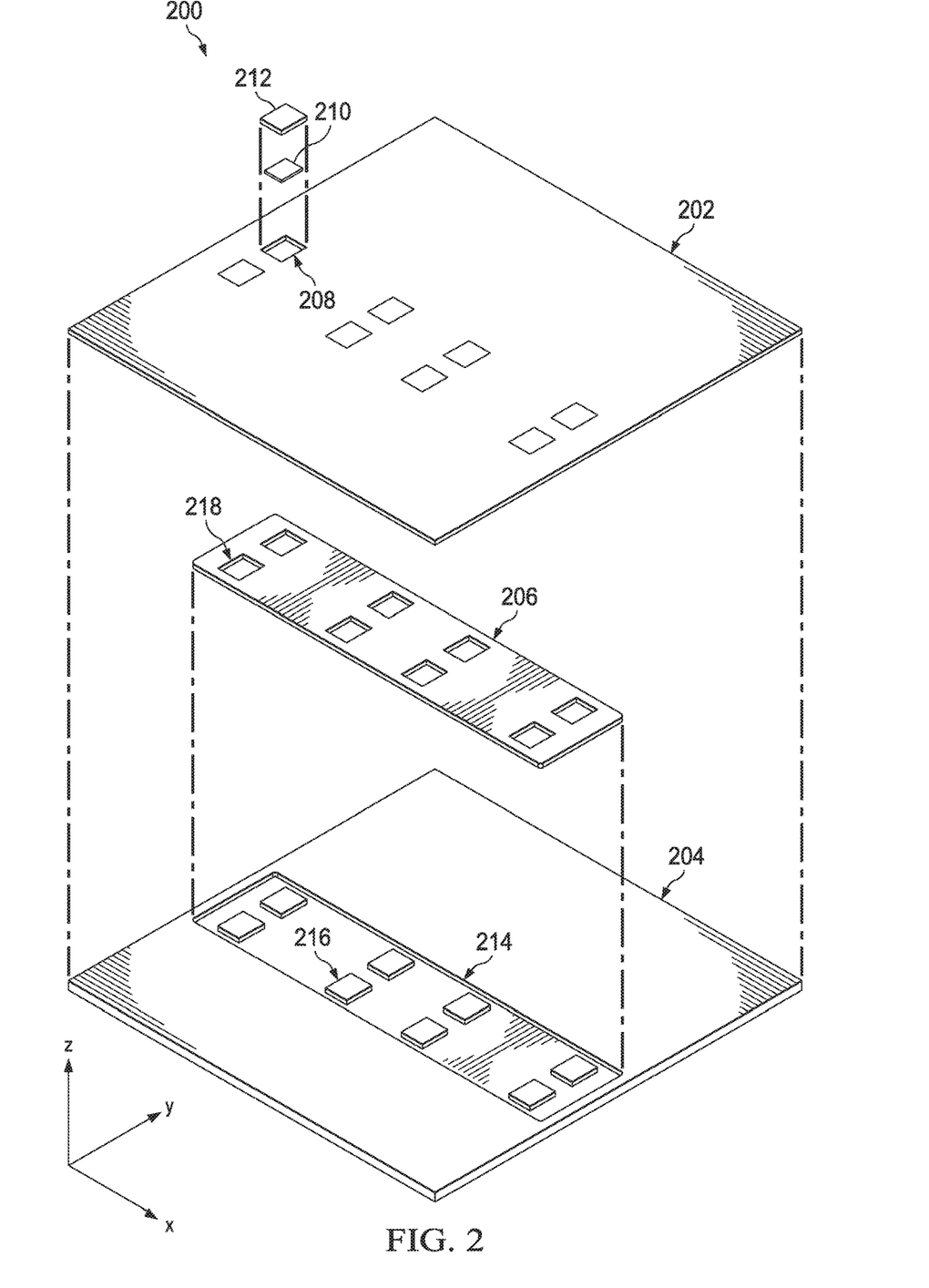
FIG. 2 illustrates a second example cover with an integrated thermal spreader for a module base according to this disclosure.

FIG. 2 illustrates a second example cover 200 with an integrated thermal spreader for a module base according to this disclosure. As shown in FIG. 2, the cover 200 includes a top encapsulation layer 202, a bottom encapsulation layer 204, and an integrated thermal spreader 206. The top encapsulation layer 202 includes various openings 208, and a tab 210 and a cladding 212 are inserted into each of the openings 208. The top encapsulation layer 202, tabs 210, and claddings 212 can be the same as or similar to the top encapsulation layer 102, tabs 110, and claddings 112 described above.

The bottom encapsulation layer 204 and the thermal spreader 206 are similar to the bottom encapsulation layer 104 and the thermal spreader 106 described above. The bottom encapsulation layer 204 in FIG. 2 includes a recess 214. The recess 214 can be sized and shaped so that it closely matches the size and shape of the thermal spreader 206 and makes good thermal contact with the sides of the thermal spreader 206. In this example, however, the recess 214 includes various pedestals 216, which represent raised portions of the bottom encapsulation layer 204 within the recess 214. The tabs 210 can be placed within various openings 218 in the thermal spreader 206 that are aligned with the openings 208 of the top encapsulation layer 202 and can contact the pedestals 216. Optionally, the pedestals 216 can fit at least partially through the openings 218 in the thermal spreader 206.

Each pedestal 216 represents a raised portion within a recess and can be formed in any suitable manner, such as by etching the bottom encapsulation layer 204 around the area forming the pedestal 216. Each opening 218 in the thermal spreader 206 also can be formed in any suitable manner, such as by cutting a graphite or other sheet or by cutting extruded graphite or other material(s).

The openings 208, tabs 210, and claddings 212 are used here to interface the thermal spreader 206 and the bottom encapsulation layer 204 with one or more devices to be cooled through the top encapsulation layer 202. The tabs 210, claddings 212, thermal spreader 206, and/or pedestals 216 may be plated with one or more metals to protect against galvanic corrosion from each other or from the encapsulation layers 202 and 204. Again, while eight openings 208, eight tabs 210, and eight claddings 212 are shown here in a four-by-two arrangement, any suitable numbers and arrangements of openings 208, tabs 210, and claddings 212 can be used. In general, one or more openings 208, one or more tabs 210, and one or more claddings 212 can be used with each device to be cooled, and each opening 208, tab 210, and cladding 212 may be used with one device or multiple devices to be cooled.

The thermal spreader 206 in this example fits at least partially within the recess 214 formed in the bottom encapsulation layer 204. In some embodiments, the thermal spreader 206 fits entirely within the recess 214. In other embodiments, the thermal spreader 206 fits partially within the recess 214 and partially within another recess in the bottom of the top encapsulation layer 202 (not shown). Once the thermal spreader 206 is positioned within the recess 214, the encapsulation layers 202 and 204 can be attached to each other, such as via thermo-compression bonding, brazing, soldering, or welding, to encapsulate the thermal spreader 206. The tabs 210 may contact the pedestals 216 of the bottom encapsulation layer 204 once inserted through the openings 208 of the top encapsulation layer 202 and through the openings 218 of the thermal spreader 206.

As described in more detail below, the cover 200 shown in FIG. 2 can be secured to a heat sink. This integrates the thermal spreader 206 and the heat sink to form at least part of a module base. One or more integrated circuit devices or other devices to be cooled can be mounted on or to the module base. The module base supports improved thermal and structural management of the devices to be cooled as described above.

In some embodiments, the tabs 210 and the thermal spreader 206 are formed from thermal pyrolytic graphite. In particular embodiments, the tabs 210 can be configured so that they have higher thermal conductivities in the x and z dimensions identified in FIG. 2 and a lower thermal conductivity in they dimension identified in FIG. 2. Also, in particular embodiments, the thermal spreader 206 can be configured so that it has higher thermal conductivities in the x and y dimensions identified in FIG. 2 and a lower thermal conductivity in the z dimension identified in FIG. 2. This arrangement allows the tabs 210 to efficiently transfer thermal energy received from the one or more devices to be cooled along the x dimension into the thermal spreader 206 and along the z dimension into the bottom encapsulation layer 204. As a result, this arrangement achieves efficient three-dimensional heat transport by spreading the heat in x and y directions in the thermal spreader 206 and simultaneously transporting the heat in the z direction directly to the bottom encapsulation layer 204 for removal from the cover 200.

In FIGS. 1 and 2, the tabs 110 or 210 and the thermal spreader 106 or 206 can be said to be "metal clad" when covered by a metal cladding 112, 212 or metal encapsulation layer 102, 202. Also, the tabs 110 or 210 and the thermal spreader 106 or 206 can be said to be "preferentially oriented" when designed to have higher thermal conductivity in the desired direction(s). Further, the tabs 110 or 210 and the thermal spreader 106 or 206 can be said to be "preferentially located" when positioned to facilitate removal of thermal energy from one or more devices mounted on or to the cover 100 or 200. Note, however, that the use of material with a directionally-dependent thermal conductivity in the tabs 110 or 210 and the thermal spreader 106 or 206 (such as thermal pyrolytic graphite) is not required. For instance, other forms of graphite besides thermal pyrolytic graphite can have high thermal conductivities in all three dimensions.

In some embodiments, graphite is used to form the thermal spreader 106 or 206 and can be clad with one or more suitable metals or other materials to tailor the thermal and structural performance of the cover 100 or 200 for a given application. Example materials that can be used to clad the graphite forming the thermal spreader 106 or 206 include copper, tungsten, copper tungsten, molybdenum, or copper molybdenum. The graphite forming the thermal spreader 106 or 206 can also be formed in any suitable shape, allowing the thermal spreader 106 or 206 to be tailored to the specific geometry of the device or devices to be cooled and the heat sink to be used with the cover 100 or 200.

The use of the claddings 112 or 212 over the tabs 110 or 210 allows the top encapsulation layer 102 or 202 of the cover 100 or 200 to directly interface with one or more devices to be cooled. For example, one or more devices to be cooled can represent one or more integrated circuit devices placed on or otherwise mounted to a silicon carbide substrate or other substrate. The claddings 112 or 212 can directly interface with the silicon carbide substrate or other substrate to remove heat from the one or more integrated circuit devices. Moreover, the use of the claddings 112 or 212 over the tabs 110 or 210 helps to provide a more consistent coefficient of thermal expansion along the top of the cover 100 or 200, which can help to reduce stresses placed on the one or more devices to be cooled.

Figure 3:
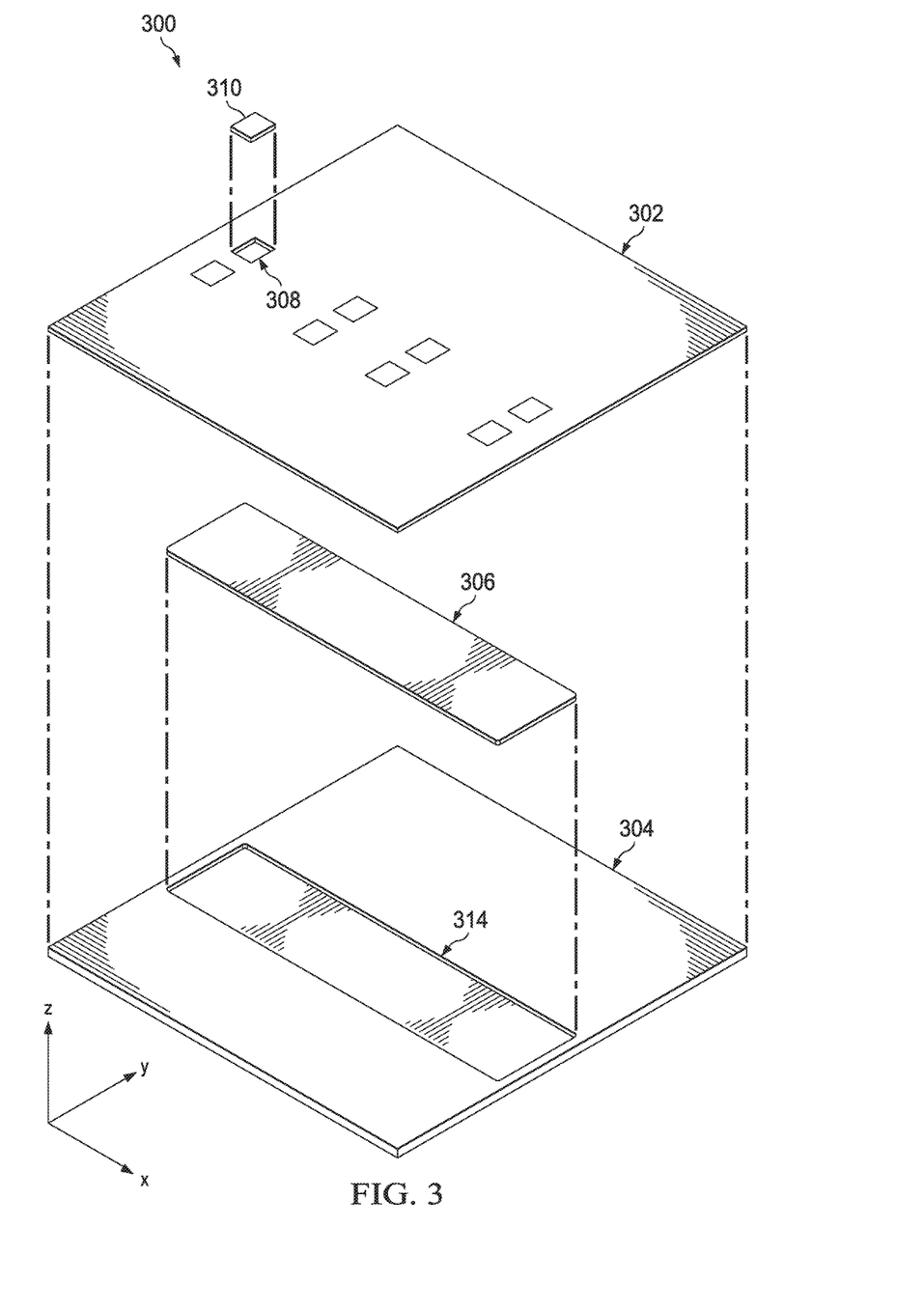
FIG. 3 illustrates a third example cover with an integrated thermal spreader for a module base according to this disclosure.

FIG. 3 illustrates a third example cover 300 with an integrated thermal spreader for a module base according to this disclosure. As shown in FIG. 3, the cover 300 includes a top encapsulation layer 302, a bottom encapsulation layer 304, and an integrated thermal spreader 306. These components 302-306 can be the same as or similar to the corresponding components 102-106 or 202-206 described above.

The top encapsulation layer 302 includes various openings 308, and a tab 310 is inserted into each of the openings 308. Each tab 310 generally operates to provide thermal energy received from one or more devices to be cooled down to the thermal spreader 306. Unlike the tabs 110 and 210, however, the tabs 310 are not positioned under claddings 112 and 212. Instead, the tabs 310 themselves can be formed from one or more metal(s) or other suitable material(s) having a low coefficient of thermal expansion (such as between about 4 to about 7 PPM/° C.) and a high thermal conductivity. In some embodiments, this allows a substantial CTE match to be achieved between the tabs 310 and at least one substrate of one or more devices to be cooled (such as when the at least one substrate of the one or more devices to be cooled is formed using silicon or silicon carbide). Example materials used to form the tabs 310 can include tungsten, copper tungsten, or copper molybdenum.

Each tab 310 can have any suitable size, shape, and dimensions. As particular examples, each tab 310 can have a rectangular shape with a smaller dimension of about 0.189 inches (about 0.48006 cm) and a longer dimension of about 0.233 inches (about 0.59182 cm) and a thickness of about 0.03 inches (about 0.0762 cm). Each tab 310 can also have straight or rounded corners. Of course, any other size and shape can be used with the tabs 310.

The tabs 310 are used here to interface the thermal spreader 306 with one or more devices to be cooled through the top encapsulation layer 302. Again, while eight tabs 310 are shown here in a four-by-two arrangement, any suitable numbers and arrangements of tabs 310 can be used. In general, one or more tabs 310 can be used with each device to be cooled.

As described in more detail below, the cover 300 shown in FIG. 3 can be secured to a heat sink. This integrates the thermal spreader 306 and the heat sink to form at least part of a module base. One or more integrated circuit devices or other devices to be cooled can be mounted on or to the module base. The module base supports improved thermal and structural management of the devices to be cooled as described above.

In some embodiments, the thermal spreader 306 is formed from thermal pyrolytic graphite. In particular embodiments, the thermal spreader 306 can be configured so that it has higher thermal conductivities in the x and z dimensions identified in FIG. 3 and a lower thermal conductivity in they dimension identified in FIG. 3. This arrangement allows the thermal spreader 306 to efficiently spread out the thermal energy received from the one or more devices to be cooled along the x dimension. The high thermal conductivity in the z direction also allows the thermal spreader 306 to efficiently transport the thermal energy received from the one or more devices to be cooled to the bottom encapsulation layer 304 for removal from the cover 300.

In FIG. 3, the tabs 310 and the thermal spreader 306 can be said to be "metal clad," "preferentially oriented," and "preferentially located." Also, in some embodiments, graphite is used to form the thermal spreader 306 and can be clad with one or more suitable metals or other materials to tailor the thermal and structural performance of the cover 300 for a given application as described above. Further, the graphite forming the thermal spreader 306 can be formed in any suitable shape, allowing the thermal spreader 306 to be tailored to the specific geometry of the device or devices to be cooled and the heat sink to be used with the cover 300. The use of tabs 310 with a low coefficient of thermal expansion allows the top encapsulation layer 302 of the cover 300 to directly interface with one or more devices to be cooled, such as when the tabs 310 can interface directly with a silicon carbide substrate or other substrate.

Note that while FIGS. 1 through 3 illustrate different embodiments of covers having integrated thermal spreaders for a module base, the covers 100, 200, 300 all follow the same general principles during operation. Each cover 100, 200, 300 can absorb thermal energy from one or more devices to be cooled through its top encapsulation layer 102, 202, 302. At least some of that thermal energy is passed to the integrated thermal spreader 106, 206, 306 within the cover 100, 200, 300. The integrated thermal spreader 106, 206, 306 spreads the thermal energy over a larger area. The cover's bottom encapsulation layer 104, 204, 304 receives the thermal energy and provides the thermal energy to an underlying heat sink attached to the bottom encapsulation layer 104, 204, 304 for removal. The tabs 110, 210, 310 in the top encapsulation layer 102, 202, 302 facilitate passage of the thermal energy from the one or more devices to be cooled through the top encapsulation layer 102, 202, 302 to the integrated thermal spreader 106, 206, 306.

Although FIGS. 1 through 3 illustrate examples of covers 100, 200, 300 with an integrated thermal spreader 106, 206, 306 for a module base, various changes may be made to FIGS. 1 through 3. For example, each cover 100, 200, 300 and its individual components can have any suitable size, shape, and dimensions. Also, components of each cover 100, 200, 300 can be replicated or omitted as needed or desired. Further, any features shown in one or more of FIGS. 1 through 3 can be used in others of FIGS. 1 through 3, and any combination of features shown in FIGS. 1 through 3 can be used in an embodiment of a cover. As a specific example, the pedestals 216 and openings 218 from FIG. 2 can be used in the covers 100 and 300 of FIGS. 1 and 3. In addition, the terms "top" and "bottom" are used here to differentiate between different encapsulation layers but do not require any specific orientation of the covers during fabrication or use. "First" and "second" can also be used to refer to the different encapsulation layers, without regard to which encapsulation layer is the first encapsulation layer and which encapsulation layer is the second encapsulation layer.

Figure 4:
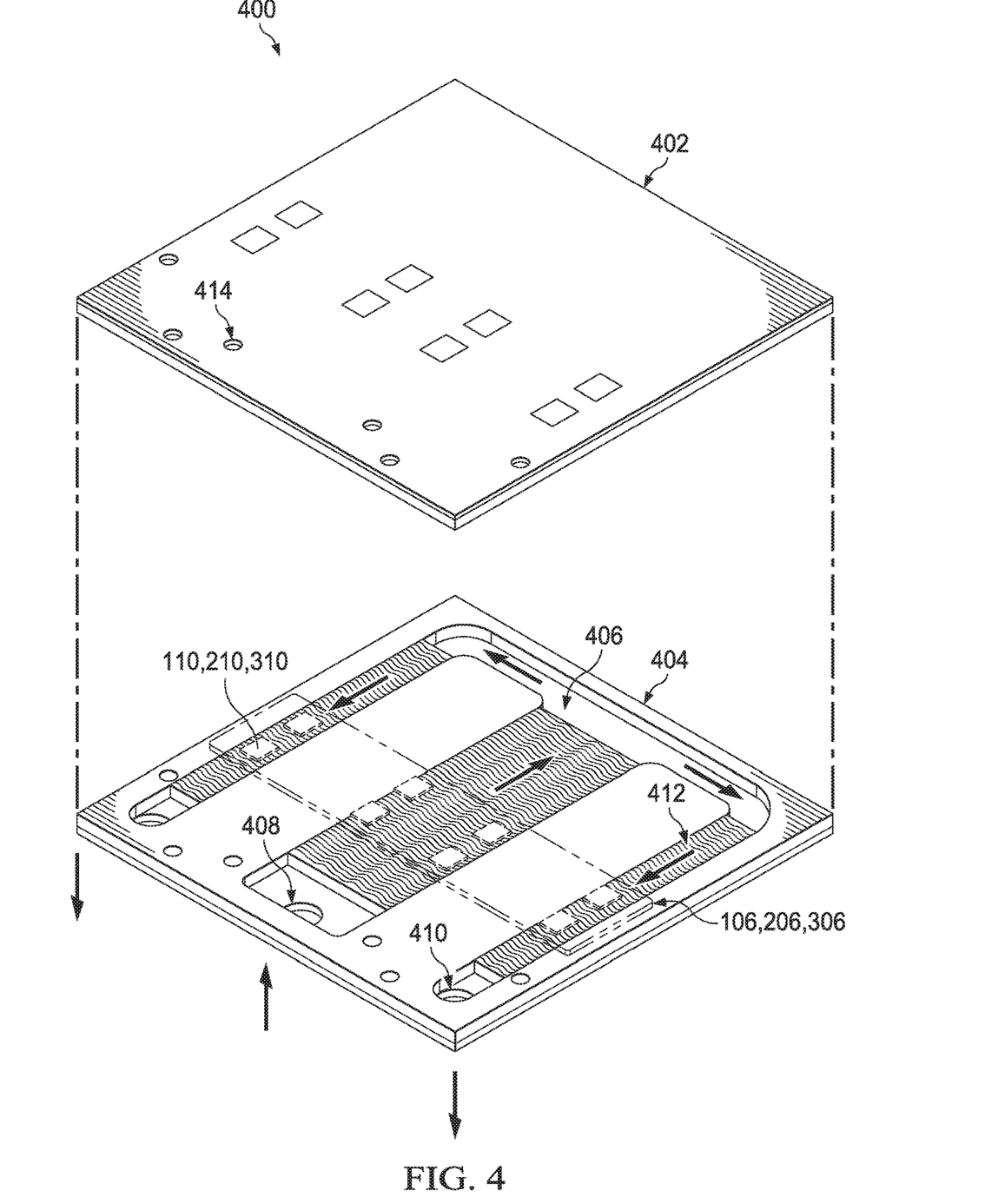
FIG. 4 illustrates an example module base with an integrated thermal spreader and heat sink for thermal and structural management of high-performance integrated circuits or other devices according to this disclosure.

FIG. 4 illustrates an example module base 400 with an integrated thermal spreader and heat sink for thermal and structural management of high-performance integrated circuits or other devices according to this disclosure. As shown in FIG. 4, the module base 400 includes a cover 402 and a heat sink 404. The cover 402 generally includes an integrated thermal spreader and can represent any of the covers 100, 200, 300 described above or any other cover designed in accordance with the teachings of this disclosure.

The heat sink 404 is configured to remove thermal energy from the cover 402 and hence from one or more devices mounted on or to the cover 402. In this example, the heat sink 404 is a fluid-based heat exchanger that allows fluid to flow through passages 406 of the heat sink 404. The fluid removes thermal energy from the cover 402 and the heat sink 404 and supports convective heat removal. The fluid enters the heat sink 404 through at least one inlet 408 and exits the heat sink 404 through at least one outlet 410. In this particular implementation, there are passages 406 providing fluid from a single inlet 408 to two outlets 410. However, this arrangement of passages 406, inlets 408, and outlets 410 is for illustration only.

The heat sink 404 may include various folded fins 412 or other structures that help to transfer thermal energy from the cover 402 and the heat sink 404 to the fluid flowing through the passages 406. For example, the folded fins 412 can increase the surface area of the heat sink 404 that contacts the fluid flowing through the passages 406. This helps to improve the transfer of thermal energy to the fluid since the thermal energy can pass through a larger surface area of the heat sink 404. The folded fins 412 include any suitable finned structure or other structure that increases the surface area of the heat sink 404. In some embodiments, there can be numerous folded fins 412 formed in the heat sink 404, such as sixty fins per inch. As can be seen in this example, the folded fins 412 can be positioned within the heat sink 404 so as to be under or near tabs and a thermal spreader located in the cover 402.

The heat sink 404 can be attached to the cover 402 of the module base 400 in any suitable manner, such as via thermo-compression bonding, brazing, soldering, or welding. Various holes 414 or other openings can be formed through the cover 402 and the heat sink 404 so that bolts or other connectors can be inserted through the holes 414 in order to secure the module base 400 to a larger device or system. Note, however, that other mechanisms for attaching the module base 400 can be used.

Although FIG. 4 illustrates one example of a module base 400 with an integrated thermal spreader and heat sink for thermal and structural management of high-performance integrated circuits or other devices, various changes may be made to FIG. 4. For example, numerous heat exchanger designs can be used in the heat sink 404, and the heat sink 404 is not limited to the specific design shown in FIG. 4. Other heat sinks (including those that do not use fluid-based heat exchangers) can be used in the module base 400.

Figure 5:
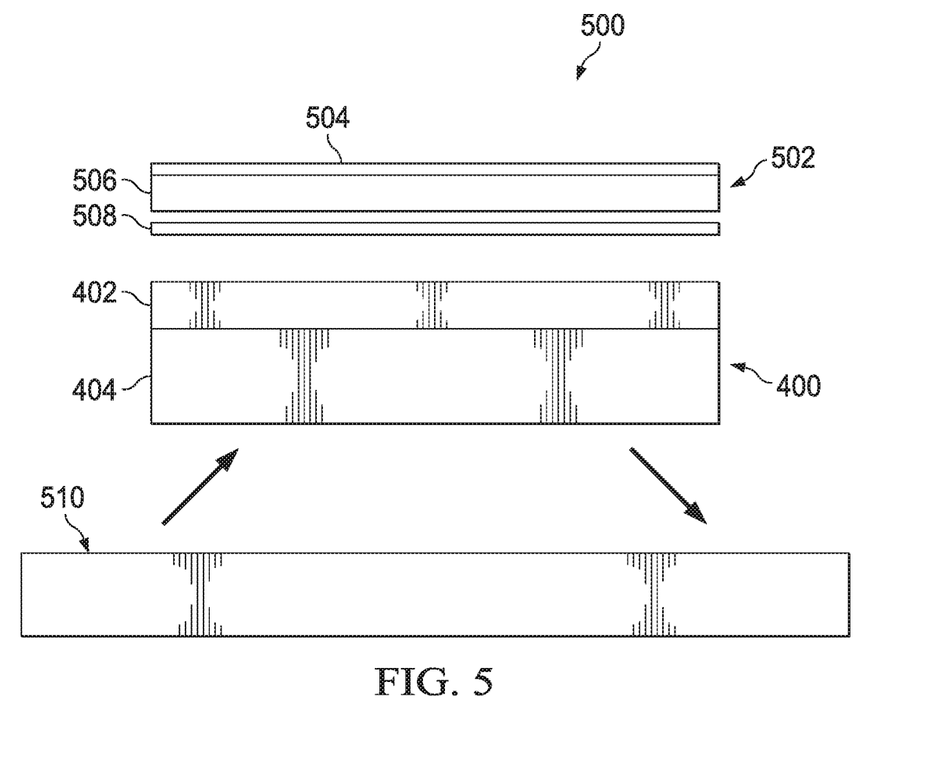
FIG. 5 illustrates an example system using a module base with an integrated thermal spreader and heat sink for thermal and structural management of high-performance integrated circuits or other devices according to this disclosure.

FIG. 5 illustrates an example system 500 using a module base with an integrated thermal spreader and heat sink for thermal and structural management of high-performance integrated circuits or other devices according to this disclosure. As shown in FIG. 5, the system 500 includes at least one instance of the module base 400, which includes the cover 402 (such as the cover 100, 200, or 300) and the heat sink 404.

At least one device 502 is mounted on or to the module base 400. Each device 502 generally represents any suitable structure that generates thermal energy to be removed using a module base 400. For example, the device 502 can include one or more integrated circuits 504 that are mounted to, formed on, or otherwise carried by a substrate 506. The one or more integrated circuits 504 can represent gallium nitride (GaN) integrated circuits or other high-performance integrated circuits, such as monolithic microwave integrated circuits. The substrate 506 can represent a silicon substrate, a silicon carbide substrate, or other substrate. Note, however, that any other suitable device or devices can be mounted on or to the module base 400.

A layer 508 of thermal interface material can be positioned between the device(s) 502 to be cooled and the module base 400 in order to ensure adequate thermal transfer to the module base 400. The layer 508 of thermal interface material can also help to facilitate rework of the device(s) 502 if necessary. In some embodiments, the layer 508 of thermal interface material is positioned at least between the substrate 506 and upper surfaces of the tabs 110, 210, 310 of the cover 402. Any suitable thermal interface material can be used in the layer 508 between the device(s) 502 to be cooled and the module base 400. In some embodiments, the layer 508 of thermal interface material is the only thermal interface material used with the module base 400. As noted above, this can help to improve the thermal performance and reduce the cost of the module base 400 and the overall system 500.

If the heat sink 404 of the module base 400 is a fluid-based heat exchanger, the system 500 can further include a fluid manifold 510. The fluid manifold 510 is used to provide cooler fluid to the heat sink 404 and to receive warmer fluid from the heat sink 404. In this way, the fluid manifold 510 helps to remove the thermal energy from the module base 400 and thus from the device(s) 502. In some embodiments, the fluid manifold 510 can be interfaced with multiple module bases 400 or with multiple heat sinks 404 to deliver coolant to the multiple module bases 400 or heat sinks 404 simultaneously. The fluid manifold 510 includes any suitable structure configured to deliver and receive fluid.

Although FIG. 5 illustrates one example of a system 500 using a module base with an integrated thermal spreader and heat sink for thermal and structural management of high-performance integrated circuits or other devices, various changes may be made to FIG. 5. For example, the system 500 can include any suitable numbers of devices 502, module bases 400, and manifolds 510. Also, the module base 400 can be used in any other suitable manner and need not be used in the specific system 500 shown in FIG. 5.

Figure 6:
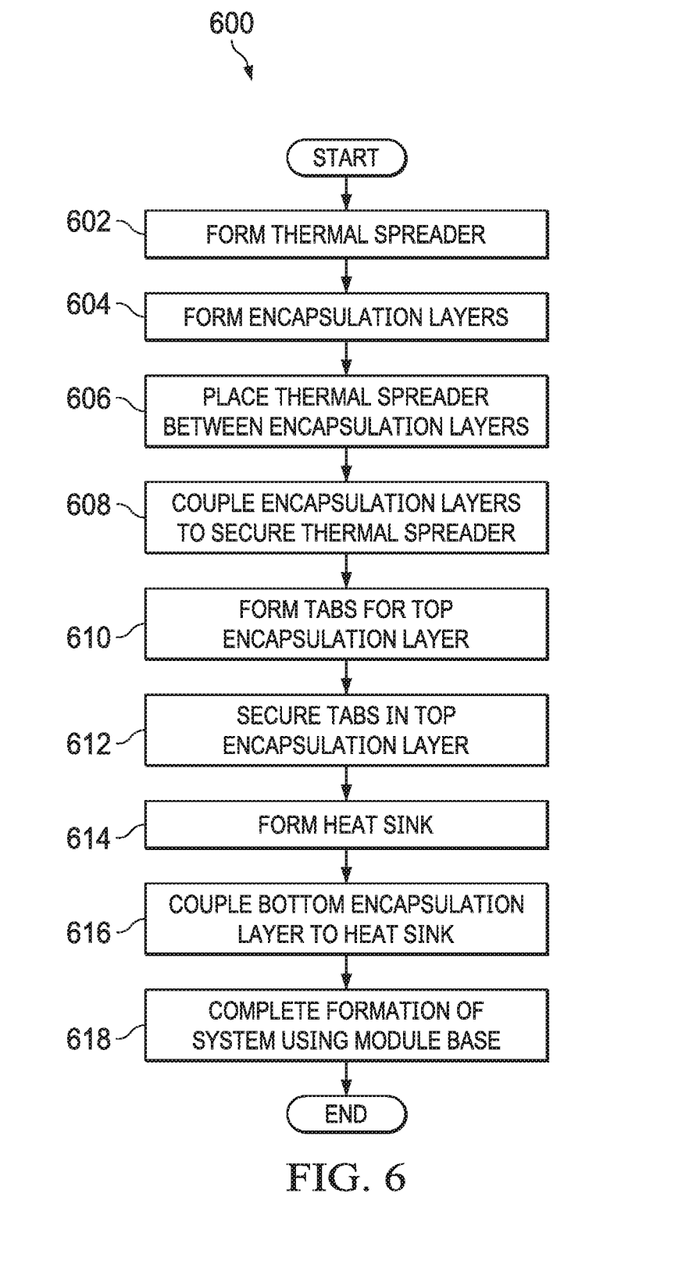
FIG. 6 illustrates an example method for providing thermal and structural management of high-performance integrated circuits or other devices according to this disclosure.

FIG. 6 illustrates an example method 600 for providing thermal and structural management of high-performance integrated circuits or other devices according to this disclosure. For ease of explanation, the method 600 is described as involving the module base 400 and the system 500 of FIG. 5. However, the method 600 can involve the use of any suitable module base, and the module base can be used in any suitable system.

As shown in FIG. 6, a thermal spreader is formed at step 602, and top and bottom encapsulation layers are formed at step 604. This can include, for example, cutting or otherwise forming a graphite sheet or processing extruded graphite to form the thermal spreader 106, 206, 306. This can optionally include forming openings 218 in the thermal spreader 206. This can also include cutting a copper or other plate and etching the plate to form each of the encapsulation layers 102-104, 202-204, 302-304. During the formation of the encapsulation layers, openings 108, 208, 308 can be formed in the top encapsulation layer 102, 202, 302. Also, during the formation of the encapsulation layers, at least one recess 114, 214, 314 can be formed in one or more of the encapsulation layers 102-104, 202-204, 302-304.

The thermal spreader is placed between the encapsulation layers at step 606, and the encapsulation layers are coupled together to secure the thermal spreader between the encapsulation layers at step 608. This can include, for example, placing the thermal spreader 106, 206, 306 into the recess 114, 214, 314 and sandwiching the thermal spreader 106, 206, 306 between the encapsulation layers 102-104, 202-204, 302-304. This can also include thermo-compression bonding, brazing, soldering, welding, or otherwise connecting the encapsulation layers 102-104, 202-204, 302-304 to secure the thermal spreader 106, 206, 306 between the encapsulation layers 102-104, 202-204, 302-304.

Tabs for the top encapsulation layer are formed at step 610. This can include, for example, cutting or otherwise processing a graphite sheet or extruded graphite to form the tabs 110, 210 or forming tabs 310 from metal or other material(s). Optionally, this can also include forming claddings 112, 212 for the tabs 110, 210. The tabs are secured in the top encapsulation layer at step 612. This can include, for example, placing the tabs 110, 210, 310 into the openings 108, 208, 308 of the top encapsulation layer 102, 202, 302. This can also include thermo-compression bonding, brazing, soldering, welding, or otherwise connecting the tabs 110, 210, 310 to other portions of the top encapsulation layer 102, 202, 302. As noted earlier, the tabs 110, 210, 310 provide a thermal interface through the top encapsulation layer 102, 202, 302 to the thermal spreader 106, 206, 306 or the bottom encapsulation layer 104, 204, 304. The numbers and positions of the tabs 110, 210, 310 can vary based on various factors, such as the number(s) and position(s) of the device(s) 502 to be cooled.

A heat sink is formed at step 614. This can include, for example, forming the heat sink 404 through casting, injection molding, additive or subtractive manufacturing, or any other suitable process. During the formation of the heat sink, suitable passages 406, inlets 408, and outlets 410 of the heat sink 404 can be formed. The heat sink is coupled to the bottom encapsulation layer of the cover at step 616. This can include, for example, thermo-compression bonding, brazing, soldering, welding, or otherwise connecting the heat sink 404 and the bottom encapsulation layer 104, 204, 304.

At this point, a completed module base has been formed, and formation of an overall system can be completed using the module base at step 618. This can include, for example, mounting one or more devices 502 on or to the module base 400 (possibly using a layer 508 of thermal interface material). This can also include fluidly coupling the module base 400 to a manifold 510. Any other or additional actions can also occur to form an overall system using the module base.

Although FIG. 6 illustrates one example of a method 600 for providing thermal and structural management of high-performance integrated circuits or other devices, various changes may be made to FIG. 6. For example, while shown as a series of steps, various steps in FIG. 6 can overlap, occur in parallel, occur in a different order, or occur any number of times. Also, subsets of the steps shown in FIG. 6 can be performed by different entities. For instance, different entities can form the various components of the module base 400, assemble the components to form the module base 400, and integrate the module base 400 into an overall system.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a module base configured to carry one or more devices to be cooled, the module base comprising a cover and a heat sink connected to the cover;
the cover comprising first and second encapsulation layers and a thermal spreader between the first and second encapsulation layers, the first encapsulation layer configured to receive thermal energy from the one or more devices to be cooled, the thermal spreader configured to spread out at least some of the thermal energy received through the first encapsulation layer and to provide the spread-out thermal energy to the second encapsulation layer;
the heat sink configured to receive the thermal energy through the second encapsulation layer and to transfer the thermal energy out of the module base;
the first encapsulation layer comprising multiple openings, the module base further comprising multiple tabs inserted through the openings, each tab configured to provide a thermal interface between at least one of the one or more devices to be cooled and the thermal spreader through the first encapsulation layer.

2. The apparatus of claim 1, wherein:
at least one of the first and second encapsulation layers comprises a recess; and
the thermal spreader is configured to fit within the recess.

3. The apparatus of claim 2, wherein:
the thermal spreader comprises multiple openings, the openings of the thermal spreader aligned with the openings of the first encapsulation layer;
the second encapsulation layer comprises multiple raised pedestals; and
the tabs are positioned within the openings of the thermal spreader and in contact with the raised pedestals.

4. The apparatus of claim 3, wherein the raised pedestals are plated to prevent galvanic corrosion caused by one or more materials of the tabs.

5. The apparatus of claim 1, wherein the module base further comprises multiple claddings, each cladding positioned over one of the tabs and within one of the openings of the first encapsulation layer.

6. The apparatus of claim 5, wherein the claddings are plated to prevent galvanic corrosion caused by one or more materials of the first encapsulation layer.

7. The apparatus of claim 1, wherein the tabs and the thermal spreader have higher thermal conductivities in common first and second directions and a lower thermal conductivity in a common third direction.

8. The apparatus of claim 1, wherein:
the tabs have higher thermal conductivities in first and second directions and a lower thermal conductivity in a third direction; and
the thermal spreader has higher thermal conductivities in the first and third directions and a lower thermal conductivity in the second direction.

9. The apparatus of claim 1, wherein the heat sink comprises:
at least one inlet configured to receive fluid into the heat sink;
one or more passages configured to transport the fluid while the fluid absorbs the thermal energy; and
at least one outlet configured to provide the fluid out of the heat sink.

10. The apparatus of claim 9, wherein the heat sink further comprises finned structures within the one or more passages.

11. The apparatus of claim 1, wherein:
the first and second encapsulation layers comprise metal;
the thermal spreader comprises graphite; and
the tabs comprise at least one of: graphite and metal.

12. The apparatus of claim 1, wherein the thermal spreader is clad with one or more metals to tailor thermal and structural performance of the module base.

13. The apparatus of claim 1, wherein the tabs are clad with metal to tailor a coefficient of thermal expansion of the tabs to substantially match a coefficient of thermal expansion of the first encapsulation layer.

14. The apparatus of claim 1, wherein the tabs are clad with metal to reduce a coefficient of thermal expansion compared to a coefficient of thermal expansion of the first encapsulation layer.

15. The apparatus of claim 1, wherein the thermal spreader is plated to prevent galvanic corrosion caused by one or more materials of the first and second encapsulation layers.

16. The apparatus of claim 1, wherein the tabs and the thermal spreader are plated to prevent galvanic corrosion caused by each other.

17. A system comprising:
one or more devices to be cooled; and
a module base carrying the one or more devices, the module base comprising a cover and a heat sink connected to the cover;
the cover comprising first and second encapsulation layers and a thermal spreader between the first and second encapsulation layers, the first encapsulation layer configured to receive thermal energy from the one or more devices, the thermal spreader configured to spread out at least some of the thermal energy received through the first encapsulation layer and to provide the spread-out thermal energy to the second encapsulation layer;

the heat sink configured to receive the thermal energy through the second encapsulation layer and to transfer the thermal energy out of the module base;

the first encapsulation layer comprising multiple openings, the module base further comprising multiple tabs inserted through the openings, each tab configured to provide a thermal interface between at least one of the one or more devices to be cooled and the thermal spreader through the first encapsulation layer.

18. The system of claim 17, wherein:
at least one of the first and second encapsulation layers comprises a recess; and
the thermal spreader is configured to fit within the recess.

19. The system of claim 17, wherein:
the thermal spreader comprises multiple openings, the openings of the thermal spreader aligned with the openings of the first encapsulation layer;
the second encapsulation layer comprises multiple raised pedestals; and
the tabs are positioned within the openings of the thermal spreader and in contact with the raised pedestals.

20. The system of claim 17, wherein the module base further comprises multiple claddings, each cladding positioned over one of the tabs and within one of the openings of the first encapsulation layer.

21. The system of claim 17, wherein the heat sink comprises:
at least one inlet configured to receive fluid into the heat sink;
one or more passages configured to transport the fluid while the fluid absorbs the thermal energy; and
at least one outlet configured to provide the fluid out of the heat sink.

22. The system of claim 21, wherein the heat sink further comprises finned structures within the one or more passages.

23. The system of claim 17, wherein:
the one or more devices comprise one or more integrated circuit devices mounted on a substrate; and
the substrate is mounted on the cover of the module base.

24. The system of claim 23, wherein:
the one or more integrated circuit devices comprise one or more gallium nitride (GaN) integrated circuit devices; and
the substrate comprises a silicon carbine (SiC) substrate.

25. The system of claim 23, wherein the one or more integrated circuit devices comprise one or more monolithic microwave integrated circuits.

26. The system of claim 23, further comprising:
a layer of thermal interface material between the substrate and the cover of the module base.

27. The system of claim 23, further comprising:
a layer of thermal interface material between the substrate and the tabs.

28. The system of claim 17, wherein the tabs are clad with metal to tailor a coefficient of thermal expansion of the tabs to substantially match a coefficient of thermal expansion of at least one substrate of the one or more devices to be cooled.

29. The system of claim 28, wherein the tabs are clad with the metal to minimize structural stress in a layer of thermal interface material between the at least one substrate of the one or more devices to be cooled and the tabs.

30. A method comprising:
placing a thermal spreader between first and second encapsulation layers, the first encapsulation layer configured to receive thermal energy from one or more devices to be cooled, the thermal spreader configured to spread out at least some of the thermal energy received through the first encapsulation layer and to provide the spread-out thermal energy to the second encapsulation layer;
connecting the first and second encapsulation layers together to secure the thermal spreader between the first and second encapsulation layers;
inserting multiple tabs through openings in the first encapsulation layer, each tab configured to provide a thermal interface between at least one of the one or more devices to be cooled and the thermal spreader through the first encapsulation layer; and
connecting a heat sink to the second encapsulation layer, the heat sink configured to receive the thermal energy through the second encapsulation layer and to transfer the thermal energy.

* * * * *